(12) United States Patent
Ranft et al.

(10) Patent No.: US 6,536,449 B1
(45) Date of Patent: Mar. 25, 2003

(54) DOWNSTREAM SURFACE CLEANING PROCESS

(75) Inventors: Craig Ranft, Fremont, CA (US); Wolfgang Helle, Munich (DE); Robert Guerra, Fremont, CA (US); Brady F. Cole, Sunnyvale, CA (US)

(73) Assignee: Mattson Technology Inc., Fremont, CA (US)

( * ) Notice: Subject to any disclaimer, the term of this patent is extended or adjusted under 35 U.S.C. 154(b) by 0 days.

(21) Appl. No.: 09/192,835

(22) Filed: Nov. 16, 1998

Related U.S. Application Data

(60) Provisional application No. 60/067,919, filed on Nov. 17, 1997.

(51) Int. Cl.$^7$ .................................................. C25F 5/00
(52) U.S. Cl. ..................... 134/1.1; 134/1.2; 134/1.3; 134/2; 134/902; 216/67; 216/75; 216/77; 438/906
(58) Field of Search ........................... 216/67, 75, 77; 134/1, 1.1, 1.2, 1.3, 2, 3, 902; 488/906; 756/345

(56) References Cited

U.S. PATENT DOCUMENTS

| | | | |
|---|---|---|---|
| 3,951,843 A | 4/1976 | Jacob ........................ 252/187 |
| 4,201,579 A | 5/1980 | Robinson et al. ........... 430/323 |
| 4,263,088 A | 4/1981 | Gorin ......................... 156/626 |
| 4,361,461 A | 11/1982 | Chang ........................ 156/643 |
| 4,370,195 A | 1/1983 | Halon et al. ................ 156/643 |
| 4,462,863 A | 7/1984 | Nishimatsu et al. ........ 156/643 |
| 4,501,061 A | 2/1985 | Wonnacott .................... 29/591 |
| 4,511,430 A | 4/1985 | Chen et al. .................. 156/643 |
| 4,529,860 A | 7/1985 | Robb ........................... 219/121 |
| 4,557,796 A | 12/1985 | Druschke et al. ........... 156/643 |
| 4,618,398 A | 10/1986 | Nawata et al. .............. 156/643 |
| 4,673,456 A | 6/1987 | Spencer et al. ............. 156/345 |
| 4,678,539 A | 7/1987 | Tomita et al. ............... 156/643 |
| 4,711,698 A | 12/1987 | Douglas ....................... 156/643 |
| 4,812,201 A | 3/1989 | Sakai et al. .................. 156/643 |
| 4,857,140 A | 8/1989 | Loewenstein ............... 156/643 |
| 4,918,031 A | 4/1990 | Flamm et al. ............... 437/225 |
| 4,933,300 A | 6/1990 | Koinuma et al. ........... 437/110 |
| 4,935,661 A | 6/1990 | Heinecke et al. ......... 313/231.31 |
| 4,938,839 A | 7/1990 | Fujimura et al. ........... 156/643 |
| 4,961,820 A | 10/1990 | Shinagawa et al. ......... 156/643 |
| 4,980,022 A | 12/1990 | Fujimura et al. ........... 156/643 |
| 5,037,506 A | 8/1991 | Gupta et al. ................ 156/646 |
| 5,057,187 A | 10/1991 | Shinagawa et al. ......... 156/643 |
| 5,068,040 A | 11/1991 | Jackson ...................... 210/748 |
| 5,138,973 A | 8/1992 | Davis et al. ................. 118/723 |
| 5,147,499 A | 9/1992 | Szwejkowski et al. ...... 156/643 |
| 5,160,408 A | 11/1992 | Long .......................... 156/656 |
| 5,174,856 A | 12/1992 | Hwang et al. ............... 156/643 |
| 5,176,790 A | 1/1993 | Arleo et al. ................. 156/643 |
| 5,198,634 A | 3/1993 | Mattson et al. ......... 219/121.43 |
| 5,200,031 A * | 4/1993 | Latchford et al. ......... 156/659.1 |
| 5,200,361 A | 4/1993 | Onishi ........................ 437/194 |
| 5,217,560 A | 6/1993 | Kurono et al. .............. 156/345 |
| 5,221,424 A | 6/1993 | Rhoades ..................... 156/643 |
| 5,226,056 A | 7/1993 | Kikuchi et al. ............... 373/18 |
| 5,227,341 A | 7/1993 | Kamide et al. ............. 437/229 |
| 5,228,052 A | 7/1993 | Kikuchi et al. ............... 373/18 |
| 5,234,529 A | 8/1993 | Johnson ...................... 156/345 |
| 5,262,279 A | 11/1993 | Tsang et al. ................ 430/311 |
| 5,294,292 A | 3/1994 | Yamashita et al. .......... 156/643 |
| 5,296,093 A | 3/1994 | Szwejkowski et al. ...... 156/643 |
| 5,300,460 A * | 4/1994 | Collins et al. .............. 437/225 |
| 5,310,456 A | 5/1994 | Kadomura ................... 156/657 |
| 5,310,703 A | 5/1994 | Visser et al. ................ 437/229 |
| 5,350,480 A | 9/1994 | Gray ........................... 156/345 |
| 5,354,417 A | 10/1994 | Cheung et al. ............. 156/643 |
| 5,356,478 A | 10/1994 | Chen et al. .................... 134/1 |
| 5,362,358 A | 11/1994 | Yamagata et al. .......... 156/643 |
| 5,382,316 A | 1/1995 | Hills et al. .................. 156/643 |
| 5,384,167 A | 1/1995 | Nishiwaki et al. .......... 427/569 |
| 5,393,374 A | 2/1995 | Sato et al. .................. 156/643 |
| 5,399,237 A | 3/1995 | Keswick et al. ............ 156/643 |
| 5,403,434 A | 4/1995 | Moslehi ...................... 156/643 |
| 5,403,436 A | 4/1995 | Fujimura et al. ............ 156/643 |
| 5,411,631 A | 5/1995 | Hori et al. .................... 216/72 |
| 5,419,805 A | 5/1995 | Jolly ......................... 156/643.1 |
| 5,449,432 A | 9/1995 | Hanawa .................... 156/643.1 |
| 5,449,433 A | 9/1995 | Donohoe ................... 156/643.1 |
| 5,451,293 A | 9/1995 | Tabara ......................... 216/13 |
| 5,462,635 A | 10/1995 | Ono et al. ................... 216/67 |
| 5,514,247 A | 5/1996 | Shan et al. ................ 156/643.1 |
| 5,534,231 A | 7/1996 | Savas ........................... 216/67 |

(List continued on next page.)

FOREIGN PATENT DOCUMENTS

| | | | |
|---|---|---|---|
| JP | 55-06423 | 5/1980 | ............ G03C/5/00 |
| JP | 58-214149 | 12/1983 | ............ G03C/5/00 |
| JP | 63-217629 | 6/1987 | ......... H01L/21/302 |
| JP | 2-222468 | 9/1990 | ............ C09D/9/00 |
| WO | WO94/20587 | 9/1994 | ............ C09K/5/04 |

OTHER PUBLICATIONS

Daniel L. Flamm et al., "The Design of Plasma Etchants," *Plasma Chemistry and Plasma Processing*, vol. 1, No. 4, 1981, pp. 317–363.

(List continued on next page.)

*Primary Examiner*—Randy Gulakowski
*Assistant Examiner*—M. Kornakov
(74) *Attorney, Agent, or Firm*—Wilson Sonsini Goodrich & Rosati

(57) ABSTRACT

Systems and methods are provided for selectively removing unwanted material from a surface of a semiconductor wafer without causing damage to or etching of underlying portions of the semiconductor. One embodiment of the invention includes the use of reactive species from a plasma source to facilitate the removal of residues remaining after metal etching on a silicon wafer, where the gases employed in creating the plasma include hydrogen, halogens such as fluorine, and little or no oxygen.

30 Claims, 6 Drawing Sheets

U.S. PATENT DOCUMENTS

| | | | |
|---|---|---|---|
| 5,556,521 A | 9/1996 | Ghanbari | 204/192.32 |
| 5,567,271 A | 10/1996 | Chu et al. | 156/659.11 |
| 5,571,366 A | 11/1996 | Ishii et al. | 156/345 |
| 5,614,060 A | 3/1997 | Hanawa | 156/643.1 |
| 5,628,871 A | 5/1997 | Shinagawa | 438/514 |
| 5,641,382 A | 6/1997 | Shih et al. | 438/669 |
| 5,647,913 A | 7/1997 | Blalock | 118/723.1 |
| 5,667,630 A | 9/1997 | Lo | 438/653 |
| 5,674,357 A | 10/1997 | Sun et al. | 156/659.11 |
| 5,690,781 A | 11/1997 | Yoshida et al. | 156/345 |
| 5,691,117 A | 11/1997 | Lutsic et al. | 430/329 |
| 5,696,428 A | 12/1997 | Pasch | 315/111.21 |
| 5,702,869 A | 12/1997 | Chien et al. | 430/313 |
| 5,747,387 A | 5/1998 | Koizumi et al. | 438/708 |
| 5,756,400 A * | 5/1998 | Ye et al. | 438/10 |
| 5,811,022 A | 9/1998 | Savas et al. | 216/68 |
| 5,824,604 A | 10/1998 | Bar-Gadda | 438/725 |
| 6,018,065 A * | 1/2000 | Baum et al. | 556/13 |
| 6,033,993 A * | 3/2000 | Love et al. | 438/745 |
| 6,062,237 A * | 5/2000 | Brown et al. | 134/1.1 |
| 6,143,191 A * | 11/2000 | Baum et al. | 216/63 |
| 6,254,792 B1 * | 7/2001 | Van Buskirk et al. | 134/1.1 |

OTHER PUBLICATIONS

M.C. Peignon et al. "A Kinetic Study of Reactive Ion Etching of Tungsten in $SF_6/O_2$ RF Plasmas," *Journal of the Electrochemical Society*, vol. 140, No. 2, Feb. 1993, pp. 505–512.

H. Namatsu et al. "Hydrocarbon–Oxygen Mixture as a Resist Etching Gas with Highly Anisotropic Etching Feature," *Journal of Electrochemical Society*, vol. 100, No. 2, Feb. 1983, pp. 523–525.

P. Singer et al. "Plasma Etch: A Matter of Fine–Tuning," *Semiconductor International*, Dec. 1995, pp. 65–68.

K. Katayama, et al. "A Study of Highly Selective Oxide Etching by ECR [Electron–Cyclotron Resonance] Plasma," *The Electrochemical Society*, vol. 93, No. 21, (1993) pp. 201–207.

L.P. Andersson et al. "Initial Etching in an RF Butane Plasma," *Journal of Vacuum Science and Technology*, vol. 28, No. 10/11 (1978) pp. 449–451.

L.A. Pederson et al. "Structural Composition of Polymers Relative to Their Plasma Etch Characteristics," *Journal of the Electrochemical Society*, vol. 129, No. 1, Jan. 1982, pp. 205–208.

K. Hirose et al. "Ion–Implanted Photoresist and Damage–Free Stripping," *Journal of the Electrochemical , Society*, vol. 141, No. 1, Jan. 1994, pp. 192–205.

U.S. patent application No. 08/727,209 filed Oct. 13, 1995, Savas, "Apparatus and Method for Pulsed Processing of a Semiconductor Substrate".

U.S. patent application No. 08/811,893 filed Mar. 6, 1996, Savas, ICP Reactor Having a Conically–Shaped Plasma–Generating Section.

* cited by examiner

Final Passivation strip and clean

| Read | Recipe 8 | Recipe Name Gres 62 | | | |
|---|---|---|---|---|---|
| Step Number | Step 1 | Step 2 | Step 3 | Step 4 | Step 5 |
| RF Time (Sec) | 0 | 25 | 85 | 10 | 0 |
| RF Delay (Sec) | 2 | 2 | 2 | 2 | 2 |
| RF Power (Watts) | 0 | 950 | 1350 | 1200 | 0 |
| Pressure (Torr) | 1.1 | 1.1 | 0.6 | 2.5 | 1.1 |
| GAS 1: SCCM | 2500 | 300 | 3000 | 0 | 3000 |
| GAS 2: SCCM | 0 | 500 | 375 | 750 | 0 |
| GAS 3: SCCM | 0 | 0 | 0 | 4100 | 0 |
| Temperature (C) | 75 | 75 | 75 | 75 | 75 |
| End Point | 0 | 0 | 0 | 0 | 0 |
| PIN/VAC/RFT%/SII | NNNNN | NNNNN | YNNNN | NNNNN | NNNNN |
| Go To Next Step | Y | Y | Y | Y | N |

FIGURE 4

Vias clean

| Read | Recipe | Recipe Name Gres 31 | | | |
|---|---|---|---|---|---|
| Step Number | Step 1 | Step 2 | Step 3 | Step 4 | Step 5 |
| RF Time (Sec) | 0 | 70 | 0 | 0 | 0 |
| RF Delay (Sec) | 2 | 2 | 2 | 0 | 0 |
| RF Power (Watts) | 0 | 700 | 0 | 0 | 0 |
| Pressure (Torr) | 0.6 | 0.6 | 0.6 | 0 | 0 |
| GAS 1: SCCM | 0 | 3000 | 3000 | 0 | 0 |
| GAS 2: SCCM | 425 | 425 | 0 | 0 | 0 |
| GAS 3: SCCM | 4500 | 0 | 0 | 0 | 0 |
| Temperature (C) | 75 | 75 | 75 | 0 | 0 |
| End Point | 0 | 0 | 0 | 0 | 0 |
| PIN/VAC/RFT%/SII | NNNNN | YNNNN | YNNNN | NNNNN | NNNNN |
| Go To Next Step | Y | Y | N | N | N |

FIGURE 5

Oxinitride loss for passivation

| Read | Recipe | Recipe Name VAP01 | | | |
|---|---|---|---|---|---|
| Step Number | Step 1 | Step 2 | Step 3 | Step 4 | Step 5 |
| RF Time (Sec) | 25 | 0 | 0 | 0 | 0 |
| RF Delay (Sec) | 2 | 2 | 2 | 0 | 0 |
| RF Power (Watts) | 950 | 0 | 0 | 0 | 0 |
| Pressure (Torr) | 1.1 | 0.6 | 1.1 | 0 | 0 |
| GAS 1: SCCM | 10 | 3000 | 3000 | 0 | 0 |
| GAS 2: SCCM | 500 | 375 | 0 | 0 | 0 |
| GAS 3: SCCM | 0 | 0 | 0 | 0 | 0 |
| Temperature (C) | 75 | 75 | 75 | 0 | 0 |
| End Point | 0 | 0 | 0 | 0 | 0 |
| PIN/VAC/RFT%/SII | NNNNN | YNNNN | YNNNN | NNNNN | NNNNN |
| Go To Next Step | Y | Y | N | N | N |

FIGURE 6

DOWNSTREAM SURFACE CLEANING PROCESS

REFERENCE TO RELATED APPLICATION

The present application claims priority from provisional application No. 60/067,919 filed Nov. 17, 1997. Provisional application No. 60/067,919 is hereby incorporated herein by reference in its entirety. U.S. application titled "Systems and Methods for Variable Mode Plasma Enhanced Processing of Semiconductor Wafers" by Leroy Luo, Rene George, Stephen E. Savas, Craig Ranft, Wolfgang Helle and Robert Guerra, being filed concurrently herewith on Nov. 16, 1998, is hereby incorporated herein by reference in its entirety.

BACKGROUND OF THE INVENTION

1. Field of the Invention

The field of the present invention relates in general to semiconductor processing. More particularly, the field of the invention relates to systems and methods for selectively removing unwanted material from a surface of a semiconductor wafer, especially those residues left after photoresist ashing and/or reactive ion etching processes.

2. Description of the Prior Art

Many of the processes used in submicron scale integrated circuit fabrication involving thin film patterning (etching) or doping of semiconductor wafers leave chemical residues embedded in or on the surface of the remaining photoresist, or other areas on the sidewalls of features or the top surface of the wafer. Often these residues are insoluble or form insoluble compounds in the typical photoresist removal process called ashing (in which active species from oxygen discharges oxidize the remaining photoresist) and are not removed by the water rinsing which follows. Such residues, if left on the surface of the wafer after photoresist removal, could cause degradation of the performance of the devices or viability of the integrated circuit and therefore should be removed. Removal of these residues can be difficult and has historically been done by immersion in wet chemical baths containing either acidic or caustic chemicals. Often such chemicals are expensive and may require special handling in use and in disposal as toxic materials.

There are some residues which are easily removed including those containing silicon, carbon and halogens which remain after polysilicon gate etch or silicon dioxide contact etch processes. However, removal of the residues and polymers from the surfaces of the device structures after other processes is often difficult and may require such aggressive liquid treatments that materials on the surfaces of the device may also be etched or undesirable contaminants may be left on the wafer surface causing performance degradation.

Often processes either involving metal etching or etching down to a metal stop layer leave difficult residues. Also, surfaces of device structures can be contaminated by particulates as a result of such wet chemical treatment. One such residue which may be difficult to remove is that found after etch patterning of an aluminum layer. In this case the photoresist ashing process environment (almost always done immediately after etching in the same tool to avoid corrosion by atmospheric moisture) is very strongly oxidizing causing the aluminum, silicon, and carbon containing residues in the photoresist to transform to a mixture including aluminum oxide which is very resistant to chemical-attack. Another such residual layer is usually found after etching of silicon dioxide to create vias. (Vias are the connections made from one level of metal lines to the adjacent level(s).) At the last stage of such an etching process there can be sputtering of the metal underlying the insulating layer causing formation of metal containing residues on the sidewalls of the vias.

There are also other etching or implantation processes which create metal or silicon containing residues or other hard polymeric materials on the surface that are very hard to remove by wet chemical processes. In most cases plasma-activated gas streams containing oxygen may be ineffective in ashing or making soluble such remnant materials on the wafer surface. Usually, exposure of such materials to plasma-activated gaseous streams containing oxygen, which is needed for ashing the photoresist, causes oxidation of such residues which forms even more difficult to remove materials. Other such residual materials might include some of the major dopants for semiconductors such as: boron; phosphorus; other metal layers, such as titanium—which is used for various purposes in the integrated circuit; silicon carbide; highly cross-linked or diamond-like carbon; and recently, copper has been used in integrated circuits, and whose oxides and residues need to be removed from insulator surfaces.

It is desirable therefore to find process techniques other than wet etching which enable such residues to be removed without causing excessive etching of other materials exposed on the wafer surface. Heretofore, dry chemical removal processes employing plasma sources separated from the wafer processing region, using flows of reactive species from that source to the wafer processing region have not been successful at removing such residues. What is needed is a system and method for selectively removing unwanted materials from a semiconductor wafer.

SUMMARY OF THE INVENTION

Aspects of the invention provide a system and method for selectively removing unwanted material from a surface of a semiconductor wafer without causing damage to or etching of underlying portions of the semiconductor.

One embodiment of the invention includes using reactive species from a plasma source to facilitate the removal of residues remaining after metal etching on a silicon wafer, where the gases employed in creating the plasma include little or no oxygen. This includes flowing a gaseous mixture with little or no oxygen to a plasma source where reactive species are created which then flow to a semiconductor wafer causing volatile or soluble species to be formed from the metal-containing residues on the semiconductor wafer. In this embodiment the oxygen flow is less than or equal to 2% of the total gas flow (and may be zero), or less than one third of the flow of hydrogen (hydrogen containing, and/or other reducing gases), whichever is less. The flow of the hydrogen, hydrogen-containing gases, and/or other reducing gases, comprises greater than 2% of the total gas flow. The hydrogen may be in molecular form as $H_2$ or other hydrogen containing gases such as methane or other hydrocarbons, ammonia or gaseous amines, water vapor or alcohols. These gases produce reactive species in the plasma which, when caused to flow to the wafer, perform selective removal (or facilitate such removal in succeeding steps) of residues which may not be removed were oxygen to be a larger component of the mixture. The reducing nature of the reactive species in this case tends to disfavor the creation of metallic oxides which are resistant to solution in water rinses. Examples of critical layers on a wafer surface which might need to be preserved from erosion or damage might include but are not limited to anti-reflective coating layers (ARC) or barrier layers such as titanium nitride or titanium.)

Suitable plasma sources useful in embodiments of the invention include, but are not limited to, an inductively coupled plasma source which may or may not employ a partial electrostatic shield (Faraday shield), as described in U.S. Pat. No. 5,534,231, downstream-type plasma-source based tools such as are commonly used for ashing photoresist, which employ a non-resonant type (waveguide based) of microwave (typically 2.45 GHz) plasma source, a resonant cavity type microwave plasma source (Evenson), or other types commonly used for plasma-based processes including RF capacitively coupled sources, a resonant microwave based source, possibly including so-called "ECR" sources, as well as UHF sources which use antenna (e) as launchers of electromagnetic energy with frequency at or above 80 MHz into the plasma.

One exemplary embodiment of the invention includes a method and system for removal of difficult residues such as those formed after the etching of aluminum, or residues formed after the resist ashing following aluminum etching. In this embodiment a processing step is performed in which a combination of hydrogen and carbon tetrafluoride gases (but with substantially no oxygen) is injected into an inductively coupled plasma source with a partial Faraday shield to form neutral and charged species to which the wafer is exposed. The wafer is held at relatively low temperature (below 100 Celsius), causing attack (leading to removal during the water rinse following processing) of the metal containing residues while leaving the critical material layers on the surface of the wafer substantially unharmed. Such treatment provides a slight degree of energetic ion bombardment (of the order or less than 80 microamperes/square centimeter) to help destroy chemical and physical bonds of the residues to the wafer surface.

In other embodiments of the invention, the residue removal process or process step or steps facilitating the removal of such residues comprise a subset of the totality of process steps carried out sequentially in the same processing system. In one aspect of these embodiments, the residue removal process is one or more of the contiguous steps of the total process such that there is no inactive interval between steps. Other steps in the total process may employ substantial amounts of oxygen gas fed to the plasma source in order to cause different effects on the materials exposed on the wafer. These steps would not substantially interfere with the reducing step in the process wherein there is little or no oxygen employed. In yet another aspect of the invention, residual oxygen from steps preceding low/no oxygen step(s) is substantially pumped out of the chamber prior to these step(s) allowing the process step(s) to avoid residual oxygen and/or its products.

In other embodiments of the invention processing steps may be done in non-contiguous time steps such that there is a time interval between steps, or other steps are done in a separate reactor chamber in the same processing system.

Still other embodiments of the invention include the use of hydrogen or hydrogen containing gases and/or halogenated gases, with substantially no oxygen, as principal constituent(s) to reduce (or otherwise react with) residues and polymers on a wafer for post-treatment following a dielectric etching step called "via" etch. In these embodiments, the residue removal process may be done prior to photoresist ashing in a photoresist ashing tool or an etching tool. Hydrogen containing gases useful in these embodiments include but are not limited to hydrocarbons, ammonia, water vapor or alcohols or mixtures of hydrogen in inert gases such as noble gases or nitrogen, partially fluorinated hydrocarbons, difluoromethane ($CH_2F_2$), other fluorocarbons (such as $CF_4$, $C_2F_6$, . . . ), $SF_6$, $NF_3$ or $F_2$ or mixtures of other halogenated gases such as freon gases. Very small amounts of oxygen may also be used, of the order of two percent or less of the total gas flow to none at all or any amount within this range.

The ions from the plasma source are typically important in this process since they help promote the chemical reaction of the neutral activated species with the residues. In one embodiment a source of RF power is applied to the wafer holding pedestal, or other means to capacitively couple RF energy into the plasma, to cause there to be a sheath adjacent to the wafer surface such that as the ions flow towards the wafer they accelerate to the wafer surface. In this embodiment the plasma source may be separated from the wafer yet be close enough that the ions flow to the wafer in sufficient quantity to help promote chemical reactions with residue on the wafer.

In other embodiments of the invention where residues are to be removed which do not require ion bombardment, the source region and wafer processing region may be distinct and separated by a distance of up to 50 centimeters. Typically the residue or polymer removal processes in these embodiments are predominantly isotropic processes wherein sputtering and ion-assisted etching processes may be present but are not the dominant mechanisms. The etching or alteration of materials on the wafer surface in these embodiments is mainly by chemical reactions of reactive neutral species produced in the plasma source.

In another embodiment of the invention, a non-resonant microwave source is used to generate a plasma. In one particular embodiment, the microwave source uses an insulating cylindrical tube which is evacuated and through which flows the appropriate gas mixture in the proper pressure. The tube passes through a resonant microwave cavity or waveguide, either perpendicular to the walls of the guide or along its length. The cavity or waveguide is typically several centimeters to tens of centimeters in width or diameter for the commonly used microwave excitation frequency of 2.45 GigaHertz, but may be larger or smaller depending on the frequency of the microwave power utilized.

BRIEF DESCRIPTION OF THE DRAWINGS

A better understanding of the objects, features and advantages of the invention can be gained from a consideration of the following detailed description of the preferred embodiments thereof, in conjunction with the appended figures, wherein:

FIG. 4 is a chart depicting illustrative steps in a 5-step process in which step 4 includes a process step with substantially no oxygen to assist in residue removal.

FIG. 5 is a chart depicting an embodiment of the invention useful for removing residue after a via etch. Step 1 of this process is performed substantially in the absence of oxygen.

FIG. 6 is a chart depicting an embodiment of the invention in which step 1 is performed substantially in the absence of oxygen.

DESCRIPTION OF THE PREFERRED EMBODIMENTS

Many modifications of the preferred embodiments of the invention disclosed above will readily occur to those skilled in the art. Accordingly, the invention is to be construed as including all structure and methods that fall within the scope of the appended claims.

Figure 1:
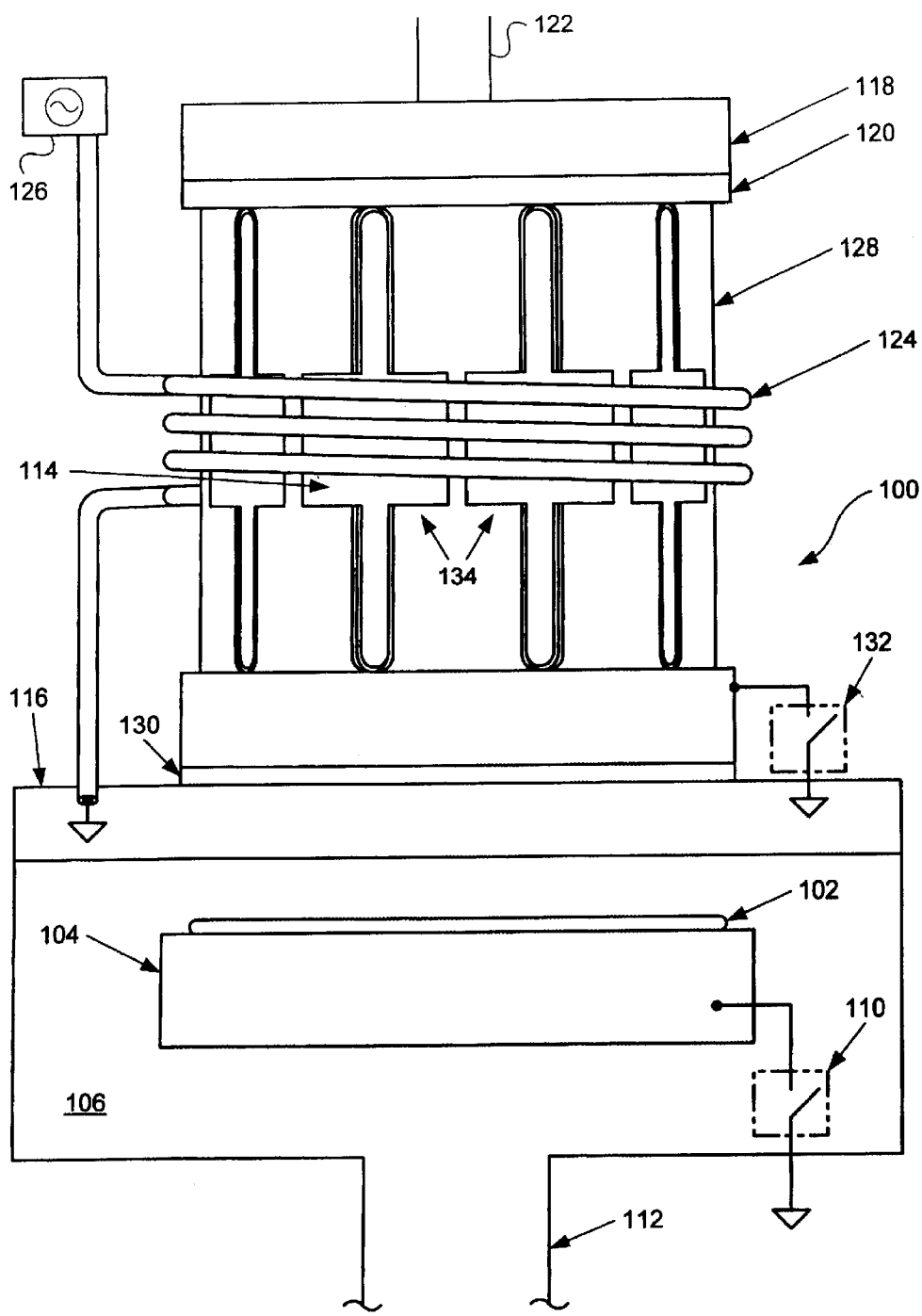
FIG. 1 illustrates an inductively coupled plasma reactor for use in an embodiment of the invention.

Aspects of the invention provide a system and method for selectively removing unwanted material from a semiconductor wafer while reducing the damage to underlying portions of the wafer. FIG. 1 depicts a plasma reactor suitable for use in an embodiment of the present invention. Other suitable reactors include, but are not limited to, those described in U.S. Pat. No. 5,534,231, which is incorporated herein by reference in its entirety; U.S. Pat. No. 5,234,529, which is incorporated herein by reference in its entirety; U.S. patent application Ser. No. 08/340,696 entitled "Inductive Plasma Reactor" filed Nov. 15, 1994 and assigned to the assignee of the present application, which is incorporated herein by reference in its entirety; U.S. patent application Ser. No. 08/811,893 entitled "ICP Reactor Having a Conically-Shaped Plasma-Generating Section" filed Mar. 5, 1997 and assigned to the assignee of the present invention, which is incorporated herein by reference in its entirety; and U.S. patent application Ser. No. 08/590,228 entitled "Hydrocarbon-Enhanced Dry Stripping of Photoresist" filed Jan. 23, 1996 and assigned to the assignee of the present application, which is incorporated herein by reference in its entirety, and any other ion-activated or reactive ion etching type reactors such as are commonly used for anisotropic etching, plasma reactors such as the Aspen ICPsm inductively/capacitively coupled RF plasma reactor (Luo et al. USPTO application No. 60/067,919—dated Nov. 17, 1997), which is incorporated herein by reference in its entirety.

FIG. 1 illustrates inductively coupled plasma reactor system 100. Semiconductor substrate 102 to be processed is placed on aluminum support 104 in processing chamber 106. Support 104 may be heated or cooled by a heating or cooling system (not shown) to heat or cool substrates for processing. Gases are exhausted from the system through exhaust outlet 112. The support 104 rests on a ceramic stand (not shown) which is slotted to allow gas to escape through outlet 112.

Support 104 may be selectively coupled to ground through switch 110. When the switch is closed, charged particles can be driven to ground through semiconductor substrate 102 and support 104. Thus, when support 104 is grounded, RF current conduction through the support is enhanced. This tends to increase the potential drop across the sheath formed by the plasma above the support. Therefore, switch 110 is typically closed when higher currents and energies of ion bombardment are used to etch substrate 102. When switch 110 is open, the potential of the support and substrate tend to float at values near the potential of the plasma and ion bombardment is reduced. Therefore, switch 110 is typically open when neutral species and lower levels of bombardment are used. In this embodiment, switch 110 is a vacuum switch relay to ground which allows support 104 to be quickly and easily switched between grounded and ungrounded states. In alternative embodiments, support 104 may be selectively coupled to a radio frequency (RF) bias to accelerate ions toward the substrate for enhanced processing. See, e.g., U.S. Pat. No. 5,534,231.

Plasma generation chamber 114 is situated above processing chamber 106. Top plate 116 of processing chamber 106 provides a common ground for the components of plasma generation chamber 114, and comprises a conductive material such as aluminum or the like. The walls of plasma generation chamber 114 are made of a nonconductive material such as quartz or alumina and have a thickness of approximately 4 to 6 mm. The generation chamber walls are fixed at their base to top plate 116 of processing chamber 106. Top lid 118 of plasma generation chamber 114 can be aluminum or similar conductive material or can be the same material as the generation chamber walls. An o-ring seal 120 is compressed between top lid 118 and the plasma generation chamber walls to provide a vacuum seal. Gas inlet 122 is provided through top lid 118 to provide gases into plasma generation chamber 114.

An inductor adjacent to plasma generation chamber 114, such as induction coil 124, electromagnetically couples power into the plasma generation chamber. In the embodiment of FIG. 1, induction coil 124 is a helical coil of copper tubing with three turns encircling plasma generation chamber 114. Other inductor configurations with a different size, number of turns or in a different shape, such as a conical or pancake shape, may also be used. Induction coil 124 is connected to RF source 126 through an impedance match network or transformer (not shown). RF power is typically supplied to the reactor at one of the Industry, Scientific, Medical (ISM) standard frequencies of 13.56, 27.12, 40.68 MHz, or other harmonics of the 13.56 MHz ISM standard frequency. Usually the power is supplied to the coils through an impedance match network or transformer at a frequency in the range from 1 to 27 MHz, although lower frequencies may be used though this probably requires an increase in the number of turns of the coil. RF energy is typically applied to the induction coil at a power of between about 500 and 3,000 Watts, or any range subsumed therein.

Split Faraday shield 128 is provided between the induction coil 124 and the plasma generation chamber 114. The bottom of split Faraday shield 128 sits on insulating ring 130 which may be used to electrically isolate the Faraday shield 128 from top plate 116 of the processing chamber. Compressed o-ring seals (not shown) are used to provide a vacuum seal. Switch 132 selectively couples the Faraday shield 128 to the ground potential provided by top plate 116.

When Faraday shield 128 is ungrounded, induction coil 124 inductively and capacitively couples power into the plasma generation chamber 114. The inductive coupling tends to drive electron currents circumferentially in a plane substantially parallel to the semiconductor substrate. The capacitive coupling modulates the plasma and drives charged particles perpendicularly toward the semiconductor substrate. In addition, the plasma produces neutral dissociated species which diffuse over the semiconductor substrate surface.

When Faraday shield 128 is grounded, it reduces the capacitive coupling between the coil and the plasma. While capacitive coupling is reduced, there is still some capacitive coupling through slots 134 formed in Faraday shield 128. The reduction in capacitive coupling, in turn, reduces the modulation of the plasma potential and the bombardment of the semiconductor substrate by charged particles. Neutral activated species continue to be produced and flow over the substrate surface.

The number and size of the slots formed in Faraday shield 128 may be varied to change the level of capacitive coupling. In the embodiment of FIG. 1, Faraday shield 128 forms slots which are narrow, about 1 cm wide, along the length of Faraday shield 128 both above and below the coil. However, the slots are much wider in the region adjacent to the turns of the coil. In this region, the width of the slots is typically in the range of from about 2 centimeters to as wide as about 90% of the distance between the slots from center to center, or any range subsumed therein. The region of Faraday shield 128 forming the wider slots is generally aligned transverse to the turns of the helical coil, extending from about 0.5 centimeter to several centimeters below the bottom turn of the coil to about 1 centimeter below to several centimeters above the top turn of the coil. In the embodiment of FIG. 1, for use with 200 mm silicon wafers, the diameter of Faraday shield 128 is about 200 mm with slots about 80 mm in distance from one another from center to center. In this embodiment the width of the slots in the region of Faraday shield 128 adjacent to the turns of the coil is about 6 cm to 6.5 cm.

The purpose of widening the slots in the region near the induction coil is to permit a desired level of capacitive coupling of the coil to the plasma even when Faraday shield 128 is grounded, thereby enhancing the energy transfer to electrons in this region and increasing the rates of ionization and production of excited species in the plasma chamber near the coil. This also serves to drive some RF current through the plasma (on the order of amperes of current at 13.56 MHz) and modulate the plasma potential to some degree (some tens of volts at 13.56 MHz). However, the modulation of the plasma potential is not sufficient to cause the plasma to diffuse out of the plasma generation chamber and into the process chamber as long as the Faraday shield 128 is grounded and able to serve as an RF anode to receive RF currents driven into the plasma by capacitive coupling from the induction coil.

If the Faraday shield 128 is poorly coupled to ground and thereby floats electrically (e.g., with switch 132 open), however, the RF currents coming from the coil into the plasma by capacitive coupling cannot easily return to ground through Faraday shield 128 and must flow elsewhere to grounded surfaces. Such surfaces include support 104 and the walls of the processing chamber. In this case, the plasma expands sufficiently to extend out of the plasma chamber and cover the region above the wafer. A relatively narrow (order of magnitude a few mm) dark space sheath is formed between the plasma and the wafer. Ions from the plasma accelerate across the sheath and bombard the wafer.

Switch 132 is used to selectively couple the Faraday shield 128 to the ground potential provided by top plate 116. When switch 132 is open, the potential of Faraday shield 128 tends to float and substantial capacitive coupling from the induction coil penetrates Faraday shield 128. Therefore, switch 132 is typically open when higher levels of ion bombardment are desired such as for etching or cleaning of substrate 102. When switch 132 is closed, Faraday shield 128 is grounded which substantially reduces capacitive coupling from the induction coil to the plasma. Therefore, switch 132 is typically closed when neutral species are used with lower levels of bombardment to process or clean sensitive areas of the substrate surface. In the exemplary embodiment, switch 132 is a vacuum switch relay to ground which allows Faraday shield 128 to be quickly and easily switched between grounded and ungrounded states.

Figure 2:
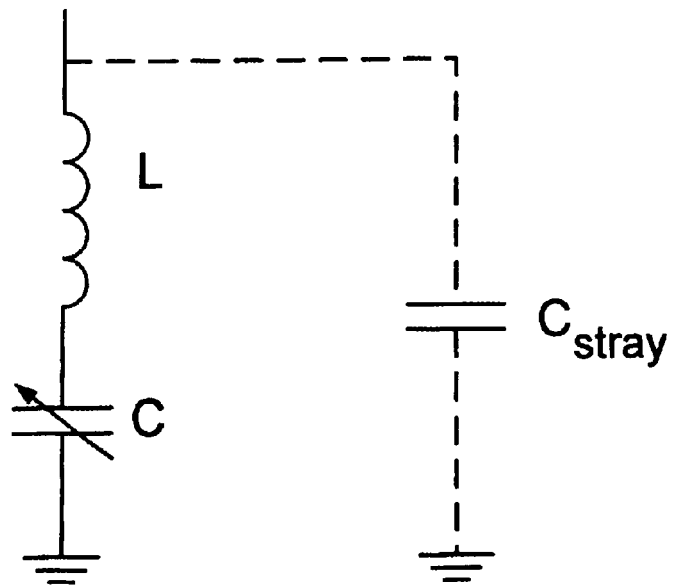
FIG. 2 illustrates a circuit used to provide variable impedances of the partial Faraday shield to ground in an alternative embodiment of the invention.

FIG. 2 illustrates a sample circuit which may be used to provide switches 110 and 132 in alternate embodiments of the present invention. Switch 110 may be formed by providing a circuit with a variable impedance between the support 104 and a ground potential. The switch is open when the circuit is tuned to provide a high impedance of the support to ground at the frequency of excitation. The variable impedance may be provided by a series LC circuit, as shown in FIG. 2, inserted between the support and a ground potential. The capacitance C is provided by a variable capacitor to allow the impedance of the circuit to be varied. The total capacitance C is selected taking into account stray capacitance, $C_{stray}$, between the aluminum block and the other elements of the plasma reactor chamber. When a high impedance is desired, the variable capacitor is tuned so the circuit provides an effective inductance in parallel resonance with the stray capacitance, $C_{stray}$, at the frequency of excitation. When a low impedance is desired, the variable capacitor is tuned to be in series resonance with inductance L at the frequency of excitation. For RF power of between about 500 to 1,500 watts at 13.56 MHz, values for inductance L may range from about 0.1 to 2.0 microhenry and the value for capacitance C may be adjustable up to about 50 to 1,000 picofarads.

Switch 132 may be formed by providing a similar series LC circuit with a variable impedance between Faraday shield 128 and ground. The capacitor is variable, and the capacitance is selected taking into account stray capacitance, $C_{stray}$, between Faraday shield 128 and other elements of the reactor. As described above, a high or low impedance may be provided by tuning the circuit to parallel resonance with $C_{stray}$ for high impedance and to series resonance for low impedance.

Figure 3:
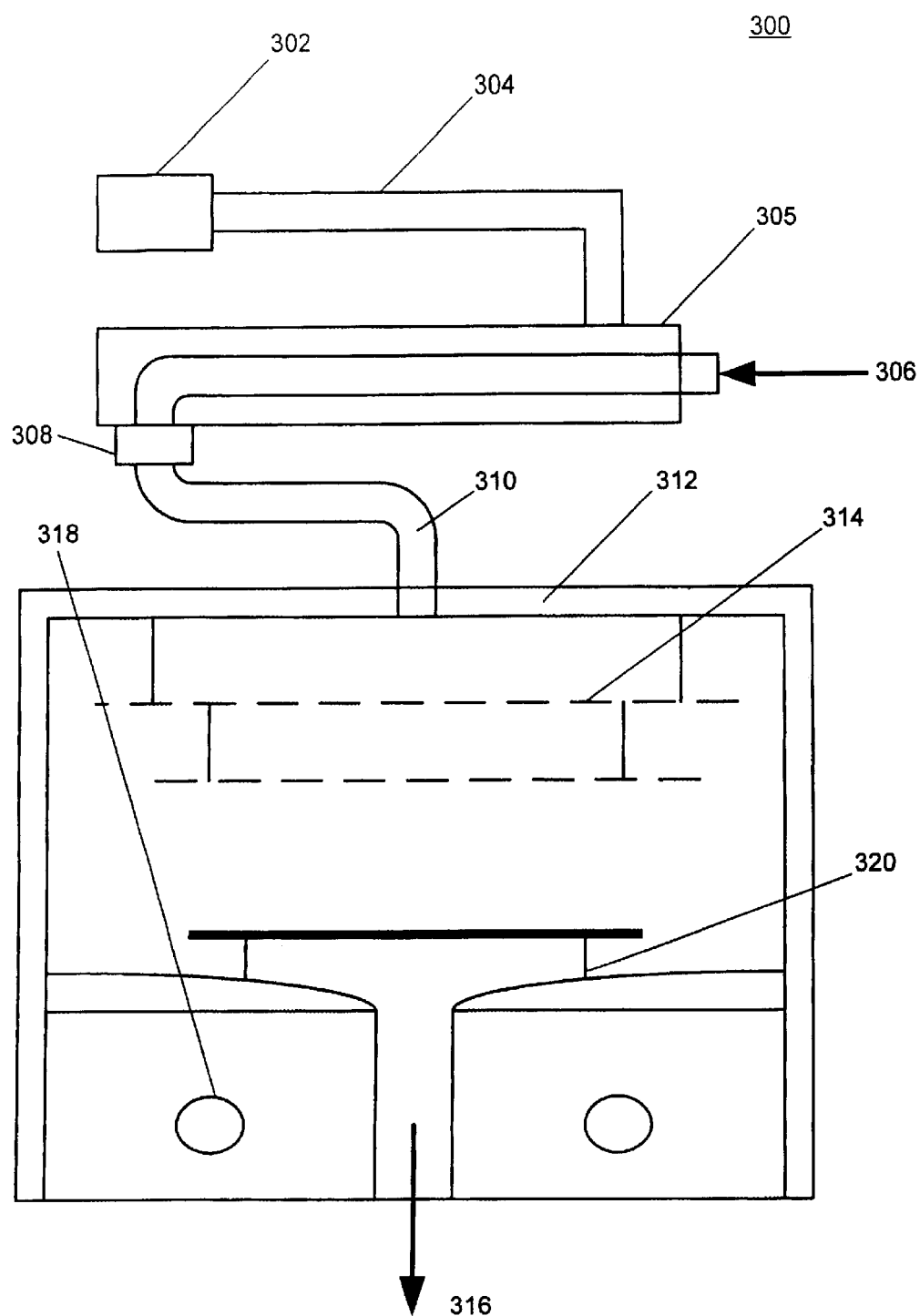
FIG. 3 illustrates a reactor with a microwave source for use in an alternative embodiment of the invention.

FIG. 3 depicts another embodiment of a processing chamber suitable for use with embodiments of the present invention. Processing system 300 includes microwave power source 302. Suitable microwave power sources include but are not limited to a magnetron or a klystron. Microwave power conduit 304 can be a waveguide or coaxial cable. Insulating tube 306 passes through a microwave cavity 305 or the properly terminated end of power conduit 304, then through the charged particle filter 308, makes right angle or large angle bends 310 and passes into chamber 312. During operation of processing system 300, gas is injected into insulating tube 306 and the density of gas in the plasma is reduced as ionization takes place as the gas passes through charged particle filter 308. In one aspect of the embodiment depicted in FIG. 3, bends 310 in insulating tube 306 reduce the charged particle content. Optional baffles or grids 314 are used to further reduce the charged particle content of the gas stream coming out of insulating tube 306. Reducing the charged particle content is important in some photoresist removal processes as it reduces the levels of alkali metals from the ash of the photoresist that are driven into the silicon oxide underlying the photoresist. Exhaust 316 in chamber 312 is connected to vacuum pumping equipment (not shown) to exhaust reacted gases. Optional heat lamps 318 can be placed in chamber 312 to heat wafer 320 if desired.

Exemplary parameters for processing a semiconductor wafer in accord with the invention using reactor embodiments of FIGS. 1 and 3 will now be described. The present invention can be implemented on any reactor capable of achieving the desired process parameters and is not meant to be limited to the two reactor embodiments of FIGS. 1 and 3.

A. Post Metal-Etch Polymer Removal

One embodiment of the invention includes a system and method suitable for the removal of residues left after etching of aluminum or other metals, or residues left after resist ashing immediately following metal etching or other metal pattern processing. The wafer to be processed is either placed in the chamber or remains in the chamber after previous processing. During step 1 of this embodiment of the invention, the wafer is held at a temperature of about 75 degrees Celsius. (This temperature may be in a range from about room temperature to as much as a few hundred degrees Celsius). This is achieved by heating a wafer support structure such as support 104 of FIG. 1 or through the use of heat lamps such as those in FIG. 3. The wafer is held for a 2 second interval at a chamber pressure of about 2.5 Torr and a flow rate of about 4,500 SCCM flow of $N_2H_2$ forming gas (typically a mixture of 5% $H_2$ and 95% $N_2$) and a flow rate of about 360 SCCM flow of $CF_4$. In one aspect of this embodiment, there is substantially no flow of oxygen into the chamber. Step 1 of this embodiment is performed to stabilize the conditions in the chamber—note no RF power is used. This step may be omitted if tight control over the gas pressure and flow during plasma operation is not required. Typically such control is necessary for consistent processing of wafers.

During step 2 a plasma is ignited in the chamber, and about 1,400 watts of RF power is applied. The chamber pressure and gas flow rates are maintained at the same level as in step 1, at a pressure of about 2.5 Torr with a $N_2H_2$ flow rate of about 4,500 SCCM and a $CF_4$ flow rate of about 360 SCCM. Optionally, the plasma potential or the potential of the wafer may be modulated to cause ions from the plasma to accelerate to the wafer. This may be desired to help speed up the chemical reactions of the gases and radicals with residues and polymers on the wafer. Using the chamber depicted in FIG. 1, this is achieved by opening switch 110.

In the embodiment of the invention discussed above, the gas pressures and flow rates in step 2 of this process may vary between pressures of 2.25 Torr and 2.75 Torr, or any range subsumed therein, flow rates can vary by 10% above or below the numbers stated above, or any range subsumed therein, preferably 5% above or below the number stated above.

In other embodiments of the invention, the wafer temperature may vary between 50 degrees Celsius and 200 degrees Celsius, or any range subsumed therein. In another aspect of this embodiment, if the parameters for gas pressure and/or gas flow for step 2 are varied, then about the same parameters are used in step 1 to stabilize the conditions in the chamber prior to plasma ignition.

In still other embodiments of the invention the two steps described above are part of a sequence of steps, in which substantially no oxygen is used to remove particularly stubborn residues or to remove the undesired products formed on the wafer by previous process steps.

Hydrogen containing gases that can be used in embodiments of the invention include but are not limited to hydrocarbons, ammonia, mixtures of hydrogen in inert gases such as noble gases or nitrogen. Other gases which may be used as a source for both halogen and hydrogen include but are not limited to halogenated hydrocarbons such as difluoromethane ($CH_2F_2$).

In still other embodiments, other additive process gases might include other fluorocarbons (such as $CF_4$, $C_2F_6$, . . . ), $SF_6$, $NF_3$ or $F_2$ or mixtures of other halogenated gases such as freon gases. Other gases may be used in small amounts in combination with these gases, possibly including vapors such as alcohol or water vapor or CO, or others which may include some oxygen. Very small amounts of pure oxygen gas may also be used, of the order of one percent or less of the total gas flow, or none at all.

Yet another embodiment of the invention includes the use of a microwave based system such as the system depicted in FIG. 3 for generating the plasma. The pressures used in this embodiment in steps 1 and 2 can vary from 10 mTorr to 10 Torr, or any range subsumed therein, preferably 100 mTorr to 2 Torr with flow rates of $N_2H_2$ or (other hydrogen containing gases) varying from 100 SCCM to 10,000 SCCM, or any range subsumed therein, preferably, 200 SCCM to 5,000 SCCM. The higher flows in this range are typically used in cases where hydrogen is present in a dilute mixture, such as in forming gas. The flow rate of $CF_4$ (or fluorine containing gas) should remain within a factor of 3 of the same proportions as in the above embodiments. Other gases which may be used as a source for both halogen and hydrogen include but are not limited to halogenated hydrocarbons such as difluoromethane ($CH_2F_2$). Other additive process gases might include other fluorocarbons (such as $CF_4$, $C_2F_6$, . . . ), $SF_6$, $NF_3$ or $F_2$ or mixtures of other halogenated gases such as freon gases. The optimal pressure to use with such a microwave source will depend on the diameter of the plasma source and the cavity modes which dominate the energy transferred to the plasma.

Other embodiments of the invention include means to cause the positive ions from the plasma to accelerate toward and bombard the wafer with enhanced energy. Suitable means include but are not limited to inducing in the plasma a potential with a significant RF component while the wafer is held on a grounded pedestal, or applying RF power to the wafer or a pedestal holding the wafer, or any other method for creation of a potential difference between the plasma and the wafer such that a sheath with an enhanced potential drop forms between the plasma and the wafer causing such ion acceleration and bombardment to take place. The level of RF power employed for this ion acceleration can range from 10 watt to 1 kilowatt or any range subsumed therein, preferably in the range of a few tens of watts to a few hundred watts for an 8 inch wafer, and the power level should scale roughly linearly with wafer area.

2. Via Etch Process

Another embodiment of the invention is useful after via etching has occurred. In this embodiment, the optional first step lasts for about 2 seconds and at a pressure of about 0.6 Torr, a flow rate of 1,500 SCCM of $N_2H_2$ is used and a flow rate of 100 SCCM of $CF_4$ is used.

In step 2 with an RF power of 1,000 watts for 40 seconds, the same pressure and flow rates as in step 1 above are used. Optionally, a source of RF energy may be applied to the wafer or the plasma to cause a sheath at the wafer which accelerates ions into the residue on the wafer to promote the chemical reactions of the ions or active neutral species with the hard residues to convert them into forms that are easier to remove.

Still another embodiment of the invention useful after via etching has occurred includes the use of a microwave based system for generating the plasma such as the system depicted in FIG. 3. The pressures used in this embodiment in steps 1 and 2 can vary from 100 mTorr to 4 Torr, or any range subsumed therein, preferably 200 mTorr to 2 Torr. In other embodiments of the invention, the flow rate of $N_2$ mixed with $H_2$, wherein the mixture of $N_2$ and $H_2$ is usually about 5% hydrogen, can vary from 300 SCCM to 2000 SCCM or any range subsumed therein, preferably 1,425 SCCM to 1,575 SCCM, and the flow rate of $CF_4$ can vary from 20 SCCM to 100 SCCM or any range subsumed therein, preferably 90 SCCM to 110 SCCM. In yet another embodiment of this invention, an RF bias is applied to the wafer, through for example, the pedestal. This helps to accelerate the ions into the residue and speed up the process, particularly in the case of hardened residues.

3. Post Passivation-Etch Wafer Cleaning

Another embodiment of the invention is suitable for use after passivation-etching (otherwise known as bond pad etching) of a wafer. This embodiment may include 3 initial steps utilizing substantial amounts of oxygen in order to strip the photoresist prior to the step in which the residues are removed.

In the first step of the cleaning process with an RF power of about 1,200 watts for about 10 seconds and a pressure of about 2.5 Torr, a flow rate of about 4100 SCCM of $N_2H_2$ and a flow rate of about 750 SCCM of $CF_4$ is used. Optionally, a source of RF energy may be applied to the wafer or the plasma to cause a sheath at the wafer which accelerates ions into the residue on the wafer to promote the chemical reactions of the ions or active neutral species with the hard residues to convert them into forms that are easier to remove.

In other embodiments of the invention, the RF power may vary from 300 watts to 3000 watts or any range subsumed therein, preferably 600 watts to 1,800 watts. The pressure may vary from 200 mTorr to 4 Torr, or any range subsumed therein, preferably 500 mTorr to 3.0 Torr. The total flow rate of the two gasses may vary from ⅓ to 3 times the flow rates above or any range subsumed therein, while the relative flow rates of the two gases may vary by up to plus or minus 50%. The duration of this step may vary between 1 second and 100 seconds or any range subsumed therein, preferably 5 seconds to 15 seconds.

Still another embodiment of the invention useful after passivation-etching of a wafer includes the use of a microwave based system for generating the plasma such as the system depicted in FIG. 3. The pressures of the cleaning step used in this embodiment can vary from 100 mTorr to 5 Torr, or any range subsumed therein, preferably 300 mTorr to 4 Torr and a flow rate of about 3,000 SCCM of $N_2H_2$ is used and a flow rate of about 400 SCCM of $CF_4$ is used. In other embodiments of the invention, the total flow rate of the two gasses may vary from ⅓ to 3 times the flow rates above, while the relative flow rates of the two gases may vary by a factor of two in either direction. In yet another embodiment of this invention, an RF bias is applied to the wafer, through for example, the pedestal. This helps to accelerate the ions into the residue and speed up the process, particularly in the case of hardened residues.

In other embodiments of this invention combinations of gases including hydrogen containing gases and halogenated gases may be used in the same source chamber and processing chamber hardware for other processes including: the reduction of oxidation residues on the surface of wafers with exposed copper; the conversion of metallic residues such as cobalt, metals of the platinum group including nickel, platinum, ruthenium, rhenium, and others to more soluble forms such as halides which may be washed off the wafer in a de-ionized water rinse; making soluble many of the alkali and transition metals which may have been left on the wafer following photoresist ashing.

FIGS. 4–6 depict recipes for various wafer fabrications processes, which includes low oxygen or no oxygen cleaning steps. FIG. 4 depicts a five-step process for final passivation strip and clean. In this process, the wafer is maintained at a temperature of about 75 degrees Celsius.

Many modifications of the exemplary embodiments of the invention disclosed above will readily occur to those skilled in the art. Accordingly, the invention is to be construed as including all structures and methods that fall within the scope of the appended claims.

We claim:

1. A method for processing metal-containing residue on a wafer, comprising:

flowing a gas that includes a halogen containing gas and ammonia and that contains substantially no oxygen containing gas into a chamber containing the wafer with residue to be removed, the halogen in the halogen containing gas consisting of fluorine;

generating a plasma from the gas wherein the plasma includes neutral particles and ions;

flowing at least a part of the plasma over the wafer; and forming soluble compounds on the wafer from the chemical interaction of the plasma with metal in the residue on the wafer.

2. The method of claim 1, comprising maintaining a chamber pressure between 2 Torr and 3 Torr.

3. The method of claim 1, wherein the halogen containing gas includes a fluorocarbon.

4. The method of claim 1, wherein generating the plasma occurs at a predetermined time after flowing the gas stars.

5. The method of claim 1, wherein generating the plasma includes using at least 1,000 watts of radio frequency power.

6. The method of claim 1, wherein flowing the gas includes flowing the ammonia at a rate between 100 SCCM and 10,000 SCCM.

7. The method of claim 6, wherein flowing the gas includes flowing the fluorine containing gas at a rate between 10 SCCM and 1,000 SCCM.

8. The method of claim 1, wherein flowing the gas includes flowing the ammonia at a rate between 1,000 SCCM and 5,000 SCCM.

9. The method of claim 8, wherein flowing the gas includes flowing the fluorine containing gas at a rate between 50 SCCM and 1,000 SCCM.

10. The method of claim 1, wherein generating the plasma includes using microwaves.

11. The method of claim 1, comprising heating the wafer to a temperature in the range between 50 degrees Celsius and 200 degrees Celsius.

12. The method of claim 1, wherein generating the plasma occurs for a time period between 20 seconds and 60 seconds.

13. The method of claim 1, wherein generating the plasma occurs for a time period between 5 seconds and 20 seconds.

14. A method for processing a metal-containing residue remaining on a wafer after photoresist ashing, the method comprising:

flowing a gas into a chamber containing the wafer with the post-ashing residue to be removed, wherein the gas contains a fluorine containing gas and an ammonia containing gas and contains substantially no oxygen containing gas;

generating a plasma from the gas wherein the plasma includes neutral particles and ions;

flowing at least a part of the plasma over the wafer; and forming soluble compounds on the wafer from the chemical interaction of the plasma with the metal in the post-ashing residue on the wafer.

15. The method of claim 14, wherein the gas includes no more than 2% oxygen.

16. The method of claim 14, comprising forming volatile compounds on the wafer from the chemical interaction of the plasma with metals in the residue on the wafer.

17. The method of claim 14, wherein the fluorine containing gas includes carbon tetrafluoride.

18. The method of claim 14, wherein the step of flowing the gas comprises flowing the ammonia containing gas at a rate between 4000 SCCM and 5000 SCCM and flowing the fluorine containing gas at a rate between 320 SCCM and 400 SCCM.

19. The method of claim 14, wherein the step of flowing the gas comprises flowing the ammonia containing gas at a rate between 1400 SCCM and 1600 SCCM and flowing the fluorine containing gas at a rate between 90 SCCM and 110 SCCM.

20. The method of claim 14, wherein the step of flowing the gas comprises flowing the ammonia containing gas at a rate between 2000 SCCM and 8000 SCCM and flowing the flourine containing gas at a rate between 250 SCCM and 2250 SCCM.

21. The method of claim 14, comprising heating the wafer to a temperature in the range between 50 degrees Celsius and 200 degrees Celsius.

22. The method of claim 14, wherein generating the plasma occurs for a time period between 20 seconds and 60 seconds.

23. The method of claim 14, wherein generating the plasma includes using microwaves.

24. The method of claim 1, wherein the metal in the residue comprises aluminum.

25. The method of claim 1, wherein the residue comprises an insoluble residue generated on the wafer from a previous metal etch process.

26. The method of claim 25, wherein the step of flowing the gas is performed after the previous metal etch process.

27. A method for processing a wafer having a metal-containing residue remaining of the wafer after photoresist ashing following etching the wafer in the presence of metal, the method comprising:

generating a plasma from a gas to form plasma products, the gas comprising a halogen-containing gas and ammonia and substantially free from oxygen containing gas; and exposing the wafer having the metal-containing post-ashing residue to at least one of the plasma products for processing wherein a halogen in the halogen containing gas consists of flourine.

28. The method of claim 27, wherein the halogen-containing gas comprises a non-chlorine halogen-containing gas.

29. The method of claim 27, wherein the gas comprises less than 2% oxygen by volume.

30. The method of claim 27, wherein the metal comprises aluminum.

* * * * *